United States Patent [19]

Kurz et al.

[11] Patent Number: 4,628,226
[45] Date of Patent: Dec. 9, 1986

[54] METHOD AND ARRANGEMENT FOR PREVENTING CATHODE DAMAGE WHEN SWITCHING ON FIELD EMISSION ELECTRON GUNS

[75] Inventors: Dieter Kurz, Aalen; Norbert Schäfer, Essingen, both of Fed. Rep. of Germany

[73] Assignee: Carl-Zeiss-Stiftung, Heidenheim, Fed. Rep. of Germany

[21] Appl. No.: 647,625

[22] Filed: Sep. 5, 1984

[30] Foreign Application Priority Data

Sep. 9, 1983 [DE] Fed. Rep. of Germany ....... 3332549

[51] Int. Cl.$^4$ .................. H05B 39/00; H01J 19/32
[52] U.S. Cl. .................... 315/102; 313/336; 313/152; 315/107; 315/74; 315/119
[58] Field of Search .............. 313/336, 152, 351; 315/102, 107, 74, 119; 361/220

[56] References Cited

U.S. PATENT DOCUMENTS

| | | | |
|---|---|---|---|
| 3,397,337 | 8/1968 | Denholm | 313/336 |
| 3,693,607 | 9/1972 | Pasbrig | 313/152 |
| 3,878,424 | 4/1975 | Suganuma | 313/336 |
| 3,921,022 | 11/1975 | Levine | 313/336 |
| 3,921,078 | 11/1975 | Aihara et al. | 313/336 |
| 3,936,756 | 2/1976 | Someya et al. | 315/107 |
| 4,019,077 | 4/1977 | Sakitani | 313/336 |
| 4,206,385 | 6/1980 | Wisbey | 315/119 |
| 4,379,250 | 4/1983 | Hosoki et al. | 313/336 |
| 4,427,886 | 1/1984 | Martin et al. | 313/336 |

FOREIGN PATENT DOCUMENTS 0051861 4/1977 Japan ................. 313/336

Primary Examiner—David K. Moore
Assistant Examiner—M. Razavi
Attorney, Agent, or Firm—Walter Ottesen

[57] ABSTRACT

The invention is directed to a method of preventing cathode damage when switching on an electron gun having a field emission cathode assembly including a cathode, a first electrode and a ground electrode. During normal operation of the electron gun, an extraction voltage is applied across the cathode and the first electrode and an accelerating voltage is applied across the cathode and the ground electrode. A direct galvanic connection is established between the cathode and the first electrode prior to normal operation of the electron gun. During a burn-in period, only the accelerating voltage is applied. This accelerating voltage may include an overvoltage of up to twenty percent. Then the galvanic connection between the cathode and the first electrode is interrupted and the extraction voltage is applied. An arrangement for carrying out the invention is also disclosed.

15 Claims, 2 Drawing Figures

METHOD AND ARRANGEMENT FOR PREVENTING CATHODE DAMAGE WHEN SWITCHING ON FIELD EMISSION ELECTRON GUNS

FIELD OF THE INVENTION

The invention relates to a method and an arrangement for preventing cathode damage when switching on electron guns having a field emission cathode which includes a cathode, a first electrode or a Wehnelt cylinder and a ground electrode. An extraction voltage is present between the cathode and the first electrode and an accelerating voltage is present between the cathode and the ground electrode when the system is in normal operation.

BACKGROUND OF THE INVENTION

For some time it has been conventional practice to equip electron guns with field emission cathodes. In this arrangement, a strong electric field is applied to a sharp-pointed cathode. As a result of the ensuing tunnel effect, the field emission tip emits electrons with only weak heat or no heat applied to the cathode.

Fine-pointed cathodes permit devices to be built that afford substantially increased brightness and have smaller electron sources. This results in higher resolution than is possible with conventional thermionic cathodes.

The invention is directed to transmission and scanning electron microscopes as well as to lithographic and electron beam processing devices. It also covers devices using field ion or other thermal point cathodes.

Electron guns are made up substantially of a cathode (also referred to as an emitter), a first electrode (also referred to as a Wehnelt cylinder), and a ground electrode. In operation, an extraction voltage $U_s$ lies between the cathode and the first electrode; in field emission guns, this voltage serves to generate the electric field necessary for field emission. Accelerating voltage $U_b$ lies between the cathode and the ground anode and the acceleration path frequently includes several electrodes.

When the voltages are switched on, flashovers resulting from absorbed layers and dust particles can hardly be avoided, in particular, after a cathode has been replaced. If this occurs, the delicate points of the field emission cathodes are often destroyed. Such flashovers may occur in either the emission gap between the cathode and the first electrode or in the acceleration gap between the first electrode and the ground electrode; in the latter case, the flashover also extends to the cathode area.

U.S. Pat. No. 3,766,427 discloses an electron gun wherein the field emission cathode is protected against flashover in the emission gap by the following arrangement. The cathode is surrounded by a so-called third electrode in the form of a cylinder having a potential in the vicinity of, or equal to, the cathode potential. Within the cylinder of the third electrode at the bottom edge thereof, a so-called fourth electrode is provided to which the extraction voltage is applied. The interior of the third electrode is configured as an ion getter pump. In addition, the third electrode can be cooled using liquid nitrogen.

Electron guns equipped with arrangements to protect the cathode in the event of flashovers occurring in the acceleration path are thus far unknown.

SUMMARY OF THE INVENTION

It is an object of the invention to provide a method for preventing field emission cathodes from being destroyed or damaged by flashovers that originate in the acceleration path. It is another object of the invention to provide an arrangement for carrying out the method of the invention.

In accordance with the invention, prior to switching on the voltages, a galvanic connection is established between the cathode and the first electrode which remains in place during a burn-in period. Further, and in accordance with the invention, only the accelerating voltage $U_b$ is applied during this burn-in period.

In this context, a galvanic connection is understood to mean a direct electrical connection having a low capacitance and a low inductance.

The accelerating voltage $U_b$ is advantageously at an overvoltage of up to 20% during the burn-in period.

The burn-in period covers a period of time between 10 and 1,000 seconds and depends upon the configuration of the electron gun and on the relevant events preceding turn on thereof.

In an advantageous embodiment, the galvanic electrical connection between emitter and first electrode is provided by an electromechanical switch located as close as possible to the location whereat the connection to the cathode is made to hold conductor lengths as short as possible thereby affording low capacitance and low inductance, so that also during a flashover, the emitter point is brought immediately to the potential of the first electrode, thereby preventing a flashover to the emitter point. The above-mentioned switch can be also a mechanical, electronic or pneumatic switch.

The switch providing the galvanic connection is mounted at a location of high voltage so that its actuation requires high-voltage insulation. In an advantageous embodiment, the switch is actuated via a power supply located in the high-voltage tank of the high-voltage source. Equally, the electric leads from the power supply to the switch require high-voltage insulation. In a particularly advantageous embodiment, the leads for the cathode heater provided in the high-voltage cable are utilized for this purpose. This is possible because the cathode requires no heating during actuation of the switch.

It is understood that actuation of the switch with high-voltage insulation can also be accomplished in a different manner using, for example, an infrared control system. Further, the switch is suitably incorporated into the cathode head.

BRIEF DESCRIPTION OF THE DRAWING

The invention will now be described with reference to the drawing wherein.

DESCRIPTION OF THE PREFERRED EMBODIMENTS OF THE INVENTION

Figure 1:
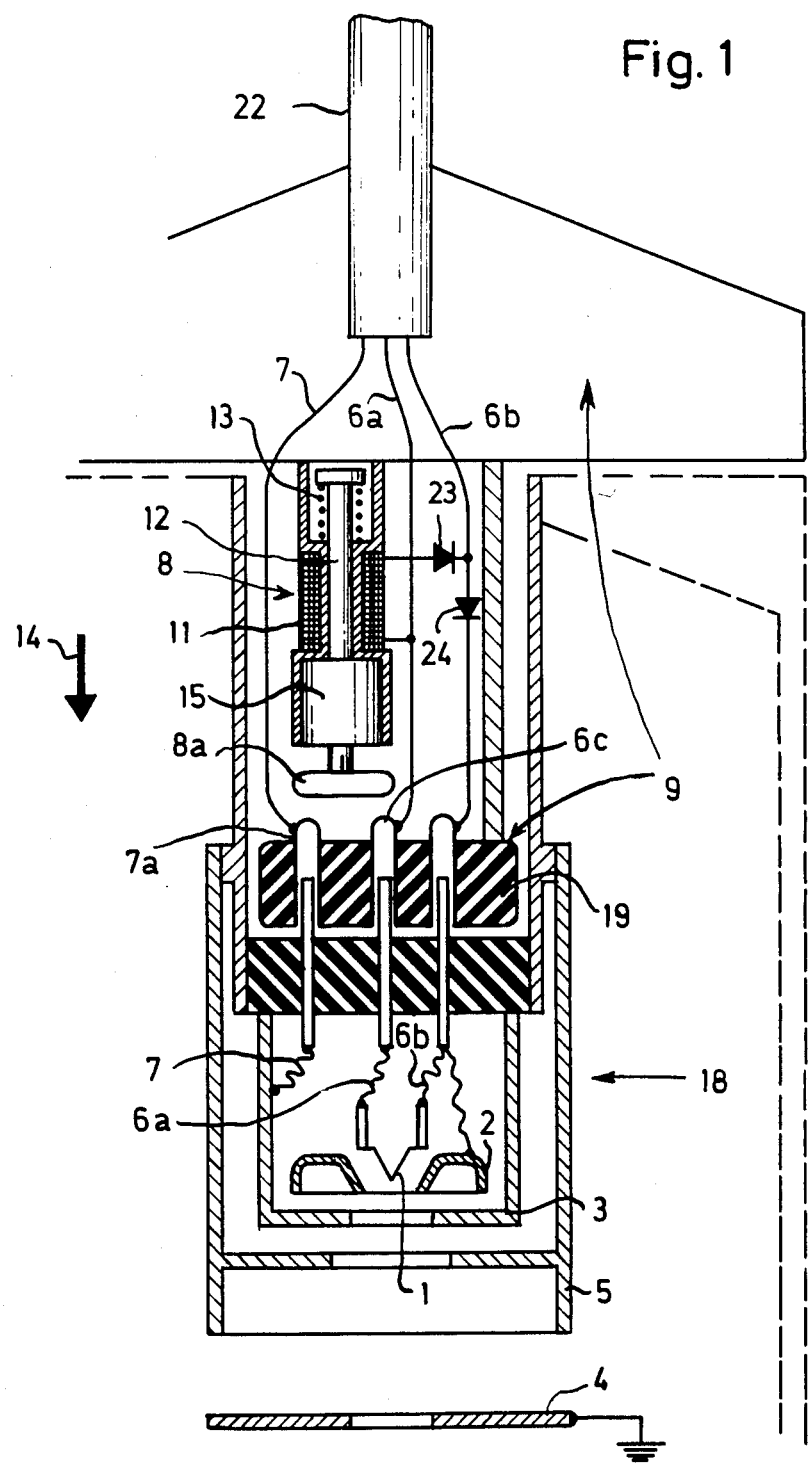
FIG. 1 is an elevation view, partially in section, of an electron gun including the cathode head and switch for providing the galvanic connection; and, FIG. 2 is a block diagram depicting the voltage supply of the electron gun, the switch and the field emission cathode assembly.

Referring now to FIG. 1, reference numeral 1 identifies the cathode which is at a high negative potential of, for example, −100 kV. Cathode 1 is surrounded by a cathode electrode 2 which is connected to the same potential as cathode 1. Reference numeral 3 identifies the first electrode or the Wehnelt cylinder to which the extraction voltage $U_s$ of, for example, −98 kV is applied. Arranged between this first electrode 3 and a ground electrode 4 is an additional anode 5 which in the simplest case is at cathode potential of −100 kV, for example. To influence the electron optics of the system, it may be advantageous to connect this electrode 5 to another potential, for example, −80 kV. The additional anode 5 likewise serves to protect the cathode 1 from flashovers and this is achieved especially because of its cylindrical configuration.

The leads to the cathode 1 are identified by 6a and 6b; whereas, the lead to the first anode 3 is designated by reference numeral 7. These leads include connector bushings 7a and 6c which can be electrically connected to each other via the contact arm 8a of switch 8. The arm 8a establishes a galvanic connection.

In a preferred embodiment, switch 8 includes a coil 11 with a magnetic core in the form of plunger 12 and a biasing spring 13. The application of voltage to the coil 11 results in movement of the magnetic plunger 12 in the direction of arrow 14 thereby actuating a mechanism 15 in the form of a mechanical flip-flop switch. The mechanical switch is of the kind commonly utilized on ball point pens, for example. Each time a voltage is applied to coil 11, the contact arm 8a will assume a position in which it alternately closes and opens the gap between the connector bushings 7a and 6c.

The switch 8 lies at high voltage so that the connection between cathode 1 and first anode 3 can be made as short as possible thereby making the connection one of low capacitance and low inductance. It is for this reason that the switch 8 is mounted directly in the high-voltage plug 9 which extends to the support 19 and is part of the cathode head identified in FIG. 1 by reference numerals 9 and 18. With this low capacitance and low inductance condition, the cathode is brought immediately to the voltage of the first electrode when the gap between connector bushings 7a and 6c has been closed by contact arm 8a, thereby preventing a flashover to the field emission tip when a flashover occurs between the ground electrode and the first electrode.

Figure 2:
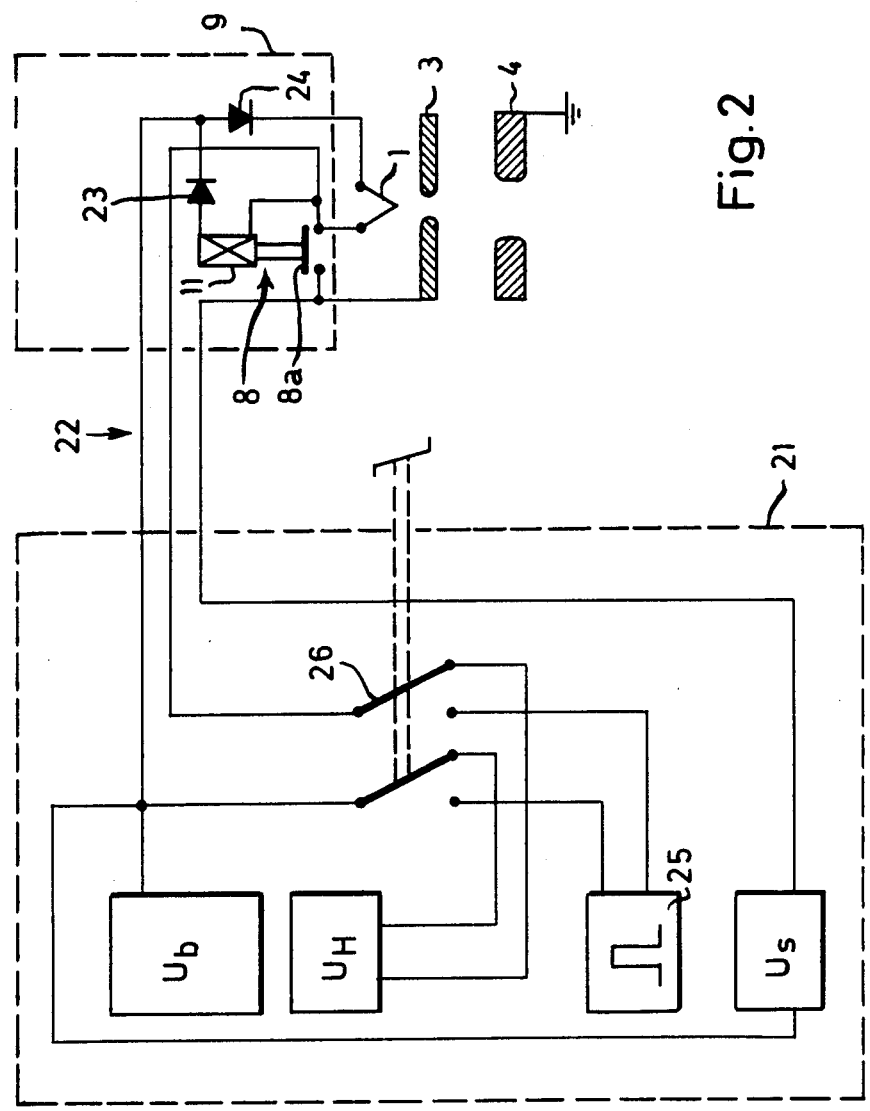

FIG. 2 illustrates an embodiment for the voltage supply of switch 8. Reference numeral 21 denotes a high-voltage tank accommodating the generators for the accelerating voltage $U_b$, for extraction voltage $U_s$ and for the cathode heater voltage $U_H$. The high-voltage tank 21 is connected to high-voltage plug 9 via high-voltage cable 22. In the plug 9, coil 11 of switch 8 is connected in parallel with cathode 1. Two diodes 23 and 24 are provided to ensure that, depending on the polarity of the voltage applied, either only cathode 1 is heated or only coil 11 is energized.

For actuating switch 8, high-voltage tank 21 also accommodates a pulse generator 25 and a change-over switch 26 which are inserted in the cathode heater lines. Actuation of change-over switch 26 causes cathode 1 to be disconnected from its heater voltage supply $U_H$ and its leads to be connected to pulse generator 25. A voltage pulse from generator 25 then causes the contact arm 8a of switch 8 to close the connection between cathode 1 and the first electrode 3. A further voltage pulse from generator 25 returns the contact arm 8a to the position in which cathode 1 and first electrode 3 are again disconnected. Subsequent thereto, the change-over switch 26 is actuated so that the cathode 1 is again connected to its heater voltage supply.

After a new cathode is mounted in place and the necessary ultra-high vacuum is generated, the connection between cathode 1 and first electrode 3 is initially established in the manner described above, followed by activation of the accelerating voltage $U_b$. During the burn-in period, it is advantageous to apply this accelerating voltage with an overvoltage of up to 20%. When no further flashovers occur, the accelerating voltage is set at the desired value, the connection between cathode 1 and first electrode 3 is interrupted, and the extraction voltage $U_s$ is energized. Finally, and if required, the cathode heater is turned on.

This turn-on procedure protects the cathode and is suitable not only after cathode replacement but also prior to any operation of the electron gun. In the latter case, however, the burn-in period is substantially shorter than after cathode replacement.

The turn-on procedure described, including the time intervals to be suitably observed, can be automated by microprocessor control.

It is understood that the foregoing description is that of the preferred embodiments of the invention and that various changes and modifications may be made thereto without departing from the spirit and scope of the invention as defined in the appended claims.

What is claimed is:

1. Method of switching on an electron gun to prevent cathode damage, the electron gun having a field emission cathode assembly including: a cathode electrode, a first electrode such as a Wehnelt cylinder and a ground electrode; and, during normal operation, an extraction voltage is applied across the cathode and the first electrode and an accelerating voltage is applied across the cathode electrode and the ground electrode, the ncthod comprising the steps of:

making a galvanic connection between the cathode electrode and the first electrode before switching on said extraction and accelerating voltages thereby starting a predetermined burn-in time period;

applying only said accelerating voltage across said cathode electrode and said ground electrode after said galvanic connection is made and during said burn-in time period; and, disconnecting said galvanic connection thereby ending said burn-in time period.

2. The method of claim 1, wherein the value of said accelerating voltage applied during said burn-in time period of up to twenty percent greater than the value of the accelerating voltage applied during normal operation of the electron gun.

3. The method of claim 1, said burn-in time period being in the range from 10 to 1000 seconds.

4. An arrangement for preventing cathode damage when switching on an electron gun having a field emission cathode assembly which includes a cathode electrode, a first electrode such as a Wehnelt cylinder and a ground electrode; the electron gun further having: extraction voltage supply means for applying an extraction voltage across the cathode electrode and the first electrode; accelerating voltage supply means for applying an accelerating voltage across the cathode electrode and the ground electrode; and, a high-voltage connector having an enclosure for accommodating respective terminals therein for connecting said voltages to said electrodes of said cathode assembly; the arrangement comprising:
- switching means lying at high voltage and mounted in said connector for establishing a galvanic connection between the terminals of said connector corresponding to said cathode electrode and said first electrode so as to cause the galvanic connection between said cathode electrode and said first electrode to be as short as possible; and,
- actuation means for actuating said switching means to establish and maintain said galvanic connection for a predetermined burn-in time period; and,
- circuit means for applying only said accelerating voltage across the cathode electrode and ground electrode during said burn-in time period.

5. The arrangement of claim 4, said connector, said cathode, said first electrode and said connector conjointly defining a cathode head assembly, said switching means being incorporated into said cathode head assembly.

6. The arrangement of claim 5, said switching means including a contact arm movable between a first position whereat said cathode and said first electrode are electrically separated from each other and a second position whereat said contact arm galvanically connects said cathode to said first electrode, said switching means including means for alternatively holding said contact in said first and second positions.

7. The arrangement of claim 4, said switching means being an electromechanical switch.

8. An electron gun wherein a burn-in period for the cathode thereof precedes normal operation of the gun thereby preventing damage to the cathode, the electron gun comprising:
- a field emission cathode assembly including: a cathode; a first electrode; and, a ground electrode;
- extraction voltage supply means for applying an extraction voltage across said cathode and said first electrode;
- accelerating voltage supply means for applying an accelerating voltage across said cathode and said ground electrode;
- switching means for establishing a galvanic connection between said cathode and said first electrode before said extraction voltage and said acceleration voltage are applied;
- actuating means for actuating said switching means to establish and interrupt said galvanic connection whereby said galvanic connection is maintained for a predetermined burn-in time period before normal operation of said electron gun is begun; and,
- circuit means for applying only said accelerating voltage across said cathode and said ground electrode during said burn-in time period.

9. The electron gun of claim 8, comprising a connector for connecting said voltages to said cathode assembly, said switching means being located directly at said connector so as to cause said galvanic connection to be as short as possible with minimal capacitance and inductance whereby said cathode potential is brought immediately to the potential of said first electrode when said galvanic connection is made.

10. The electron gun of claim 9, said connector, said switching means, said cathode and said first electrode conjointly defining a compact composite unit.

11. The electron gun of claim 10, comprising: a high-voltage tank for accommodating said extraction voltage supply means and said accelerating voltage supply means; and, a high voltage cable connecting said high-voltage tank to said composite unit; said actuation means including: actuating voltage means arranged in said high-voltage tank and leads disposed in said cable for connecting said actuation voltage means to said switching means; and, an actuating switch connected into said leads for making and interrupting the electrical connection of said actuating voltage means to said switching means.

12. The electron gun of claim 11, comprising cathode heater voltage source means arranged in said high-voltage tank, said cathode also being connected to said leads and said actuating switch being a change-over switch for disconnecting said heater voltage source means from said leads while at the same time connecting said actuating voltage means to said switching means; said actuating voltage means supplying a dc voltage pulse of one polarity and said heater voltage source supplying a dc voltage of a polarity opposite to said one polarity; and, recognition circuit means for recognizing said polarities and directing said last-mentioned voltages to corresponding ones of said switching means and said cathode.

13. The electron gun of claim 12, said cathode assembly further including an additional electrode arranged between said first electrode and said ground electrode and being at a potential close to the potential of said cathode.

14. The electron gun of claim 13, said additional electrode being configured so as to enclose said cathode and said first electrode.

15. An electron gun wherein a burn-in period for the cathode electrode thereof precedes normal operation of the gun thereby preventing damage to the cathode electrode, the electron gun comprising:
- a field emission cathode assembly including: a cathode electrode; a first electrode; and, a ground electrode;
- extraction voltage supply means for applying an extraction voltage across said cathode electrode and said first electrode;
- accelerating voltage supply means for applying an accelerating voltage across said cathode electrode and said ground electrode;
- solenoid means actuable between a first position whereat said cathode electrode and said first electrode are disconnected from each other and a second position whereat said cathode electrode and said first electrode are shorted for providing a galvanic connection therebetween before said extraction voltage and said acceleration voltage are applied;
- pulse generator means for supplying a first voltage pulse for actuating said solenoid means so as to cause the same to move from said first position into said second position for a predetermined burn-in time period and then for supplying a second voltage pulse for actuating said solenoid means so as to cause the same to move from said second position back to said first position thereby removing said short and ending said burn-in time period;
- switching circuit means for connecting said pulse generator means to said solenoid means; and,
- circuit means for applying only said accelerating voltage across said cathode and said ground electrode during said burn-in time period.

* * * * *

UNITED STATES PATENT AND TRADEMARK OFFICE
CERTIFICATE OF CORRECTION

PATENT NO. : 4,628,226

DATED : December 9, 1986

INVENTOR(S) : Dieter Kurz and Norbert Schäfer

It is certified that error appears in the above-identified patent and that said Letters Patent is hereby corrected as shown below:

In column 4, line 41: delete "ncthod" and substitute -- method -- therefor.

In column 4, line 56: delete "of" and substitute -- is -- therefor.

Signed and Sealed this

Seventeenth Day of March, 1987

Attest:

DONALD J. QUIGG

Attesting Officer

Commissioner of Patents and Trademarks